(12) United States Patent
Ho et al.

(10) Patent No.: US 6,981,320 B2
(45) Date of Patent: Jan. 3, 2006

(54) CIRCUIT BOARD AND FABRICATING PROCESS THEREOF

(75) Inventors: Kwun-Yao Ho, Hsin-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 107 days.

(21) Appl. No.: 10/748,478

(22) Filed: Dec. 29, 2003

(65) Prior Publication Data
US 2004/0238215 A1    Dec. 2, 2004

(30) Foreign Application Priority Data
May 29, 2003    (TW) ................................. 92114526 A (51) Int. Cl.
*H01K 3/10*    (2006.01)
(52) U.S. Cl. .............................. 29/852; 29/825; 29/830
(58) Field of Classification Search .................. 29/825, 29/830, 852
See application file for complete search history.

(56) References Cited

U.S. PATENT DOCUMENTS

| | | | | |
|---|---|---|---|---|
| 4,868,350 A | * | 9/1989 | Hoffarth et al. | 174/266 |
| 5,220,723 A | * | 6/1993 | Okada | 29/830 |
| 5,274,912 A | * | 1/1994 | Olenick et al. | 29/830 |
| 5,719,354 A | * | 2/1998 | Jester et al. | 174/255 |
| 6,344,371 B2 | * | 2/2002 | Fischer et al. | 438/106 |
| 6,618,940 B2 | * | 9/2003 | Lubert et al. | 29/846 |
| 6,834,426 B1 | * | 12/2004 | Japp et al. | 29/830 |

* cited by examiner

*Primary Examiner*—Carl J. Arbes
(74) *Attorney, Agent, or Firm*—J.C. Patents

(57) ABSTRACT

A circuit board and a fabricating process thereof is provided. The present invention employs a core layer as a base layer, wherein the core layer is a core conducting layer, or is a core dielectric layer having two conducting layers. By using this core layer and two patterned conductive layers, a three-conducting-layer circuit board or a four-conducting-layer circuit board is fabricated. Furthermore, both circuit boards can be used as circuit board units to fabricate circuit boards having more than four conducting layers. The present invention adopts lamination processes and equipment instead of using complicated build-up process. Therefore, the present invention effectively reduces the production costs and simplifies the process cycle for fabricating circuit boards, and is suitable for mass production.

6 Claims, 9 Drawing Sheets

CIRCUIT BOARD AND FABRICATING PROCESS THEREOF

CROSS-REFERENCE TO RELATED APPLICATION

This application claims the priority benefit of Taiwan application serial no. 92114526, filed on May 29, 2003.

BACKGROUND OF THE INVENTION

1. Field of the Invention

This invention generally relates to a circuit board and fabricating process thereof, and more particularly to a process of fabricating a circuit board using a circuit board unit with a core layer.

2. Description of the Related Art

Flip chip bonding technology is widely used for chip scale package ("CSP"). Flip Chip describes the method of electrically and mechanically connecting the die to the package carrier. The package carrier, either substrate or printed circuit board ("PCB"), and then provides the connection from the die to the exterior of the package. The interconnection between die and carrier in flip chip packaging is made through a plurality of conductive bumps that is placed directly on the die surface. The bumped die is then flipped over and placed face down, with the bumps electrically and mechanically connecting to the carrier. After the die is soldered, underfill is applied between the die and the carrier, around the solder bumps. The underfill is designed to contract the stress in the solder joints caused by the difference in thermal expansion between the silicon die and carrier.

The boom in flip chip packaging results both from the advantages in size, performance, flexibility, reliability, and cost over other packaging methods and from the widening availability of flip chip materials, equipment, and services. Eliminating bond wires reduces the delaying inductance and capacitance of the connection by a factor of 10, and shortens the path by a factor of 25 to 100. The result is high speed off-chip interconnection. Flip chip also gives the greatest input/output connection flexibility. Flip chip connections can use the whole area of the die, accommodating many more connections on a smaller die. Hence, Flip chip technology is suitable for high pin count package.

As for the carrier, because the rigid substrate is suitable for high-density and high-signal-count layout, flip chip bonding technology generally adopts the rigid substrate as a carrier. The most common rigid substrate processes are laminate and build-up processes. Because the carrier made by build-up processes allows a higher routing density, build-up processes on the rigid substrates are more popular.

Build-up technology uses a core layer as a base layer and forms a plurality of through holes on the core layer by mechanical drill. Then plated through hole ("PTH") technology is used to form electrical plug inside those through holes. Dielectric layers and patterned conducting layers then are formed to form a rigid substrate. Furthermore, to electrically connect two conducting layers, openings are formed on the dielectric layer by using photo via, laser ablation and plasma etching procedures to expose the underlying conducting layer. Then the conducting materials are deposited into the openings to form the conductive vias thereby electrically connecting these two conducting layers.

However, the conventional build-up technology requires complex processes including plating, photo via, laser ablation and plasma etching procedures. Plating and photo via cause a long process cycle; the costs of laser ablation and plasma etching are relatively high.

SUMMARY OF THE INVENTION

The present invention provides a process of fabricating a circuit board, comprising: (a) providing a core layer, a first dielectric layer, and a second dielectric layer, the first dielectric layer including at least a first conducting column through the first dielectric layer, the second dielectric layer including at least a second conducting column through the second dielectric layer; (b) laminating the core layer, the first dielectric layer, and the second dielectric layer to form a laminating layer, the core layer being disposed between the first dielectric layer and the second dielectric layer; (c) forming a first through hole through the laminating layer; (d) filling the first through hole with conducting material to form a third conducting column; and (e) forming a first patterned conducting layer and a second patterned conducting layer on two sides of the laminating layer respectively.

In a preferred embodiment of the present invention, the core layer in step (a) includes a core conducting layer and at least a core dielectric column through the core conducting layer; the first through hole in step (c) is through the core dielectric column.

In a preferred embodiment of the present invention, the core layer in step (a) includes a core dielectric layer, at least a core conducting column passes through the core dielectric layer, a third patterned conducting layer, and a fourth patterned conducting layer; the third and fourth patterned conducting layers are positioned on two sides of the core dielectric layer; the first through hole in step (c) passes through the core dielectric layer.

The present invention also provides a circuit board, including at least a laminated circuit board unit; the laminated circuit board unit at least includes: a core layer; a first dielectric layer, laminated on one side of the core layer, having at least a first conducting column through the first dielectric layer; a second dielectric layer, laminated on the other side of the core layer, having at least a second conducting column passing through the second dielectric layer; a first conducting layer, laminated on the first dielectric layer, electrically connecting to the core layer via the first conducting column; a second conducting layer, laminated on the second dielectric layer, electrically connecting to the core layer via the second conducting column; and at least a third conducting column passes through the first dielectric layer, the core layer, and the second dielectric layer, the third conducting column electrically connecting to the first conducting layer and the second conducting layer.

In a preferred embodiment of the present invention, the core layer includes a core conducting layer and at least a core dielectric column passes through the core conducting layer; the third conducting column passes through the core dielectric column in the core layer.

In a preferred embodiment of the present invention, the core layer includes a core dielectric layer, at least a core conducting column, a third patterned conducting layer, and a fourth patterned conducting layer; the core conducting column passes through the core dielectric layer; the third patterned conducting layer and the fourth patterned conducting layer are positioned on two sides of the core dielectric layer; the third conducting column passes through the core dielectric layer in the core layer.

Accordingly, the present invention employs a circuit board unit having a core layer to fabricate a circuit board, wherein the core layer is a core conducting layer, or is a core dielectric layer with two conducting layers. Furthermore, the present invention adopts lamination processes and equipment instead of build-up process. Hence, the present invention effectively reduces the production costs and simplifies the process cycle for fabricating circuit boards.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

FIGS. 1A–1F are cross-sections of the process of fabricating the first circuit board in accordance with a preferred embodiment of the present invention. The first circuit board in accordance with a preferred embodiment of the present invention is a three-conducting-layer circuit board.

Figure 1A:
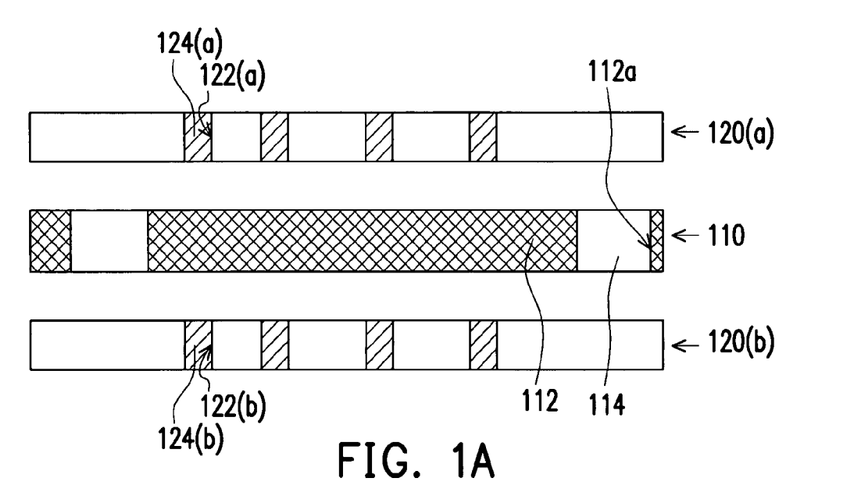
FIGS. 1A–1F are cross-sections of the process of fabricating the first circuit board in accordance with a preferred embodiment of the present invention.

Referring to FIG. 1A, a core layer 110, a dielectric layer 120a and dielectric layer 120b are provided. Core layer 110 includes a core conducting layer 112 and a plurality of core dielectric column 114 through core conducting layer 112. The core dielectric columns 114 are substantially coplanar on the two sides of core conducting layer 112. Further, dielectric layer 120a includes a plurality of conducting columns 124a passing through the dielectric layer 120a. Those conducting columns 124a are disposed in the through holes of dielectric layer 120a and are substantially coplanar with the two sides of dielectric layer 120a. Dielectric layer 120b includes a plurality of conducting columns 124b passing through dielectric layer 120b. Those conducting columns 124b are disposed in the through holes of dielectric layer 120b and are substantially coplanar with the two sides of dielectric layer 120b.

Figure 1B:
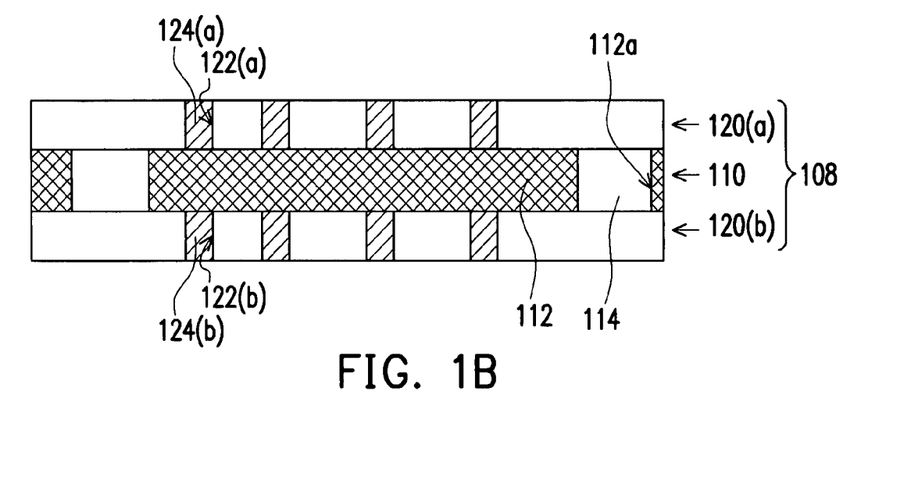

Referring to FIG. 1B, the dielectric layer 120a, the core layer 110, and the dielectric layer 120b are then laminated to form a laminating layer 108. Hence, the conducting columns 124a is electrically connected to core conducting layer 112; the conducting columns 124b is electrically connected to core conducting layer 112 and thus can be electrically connected to conducting columns 124a via core conducting layer 112.

Figure 1C:
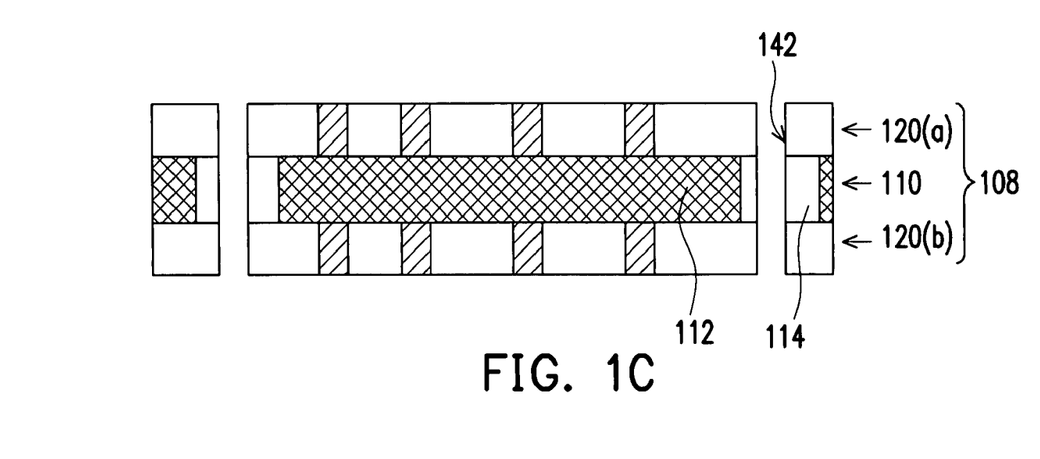

Referring to FIG. 1C, after laminating layer 108 is formed, a plurality of through holes 142 are formed by using mechanical drilling or laser drilling. Through holes 142 are passed through the dielectric layer 120a, the core dielectric column 114, and the dielectric layer 120b, and connect the two sides of the laminated layer 108.

Figure 1D:
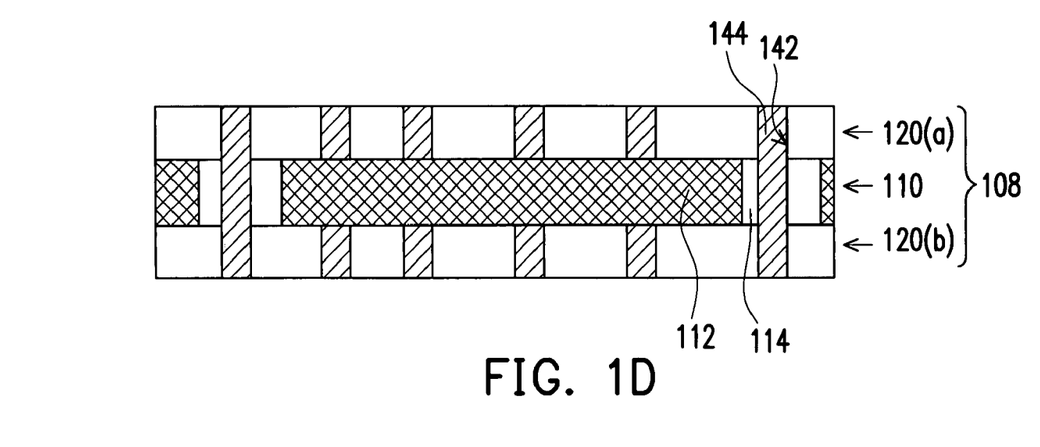

Referring to FIG. 1D, through holes 142 are filled with conducting material (such as conducting paste) to form a plurality of conducting columns 144. The conducting columns 144 are coplanar with the two sides of laminating layer 108.

Figure 1E:
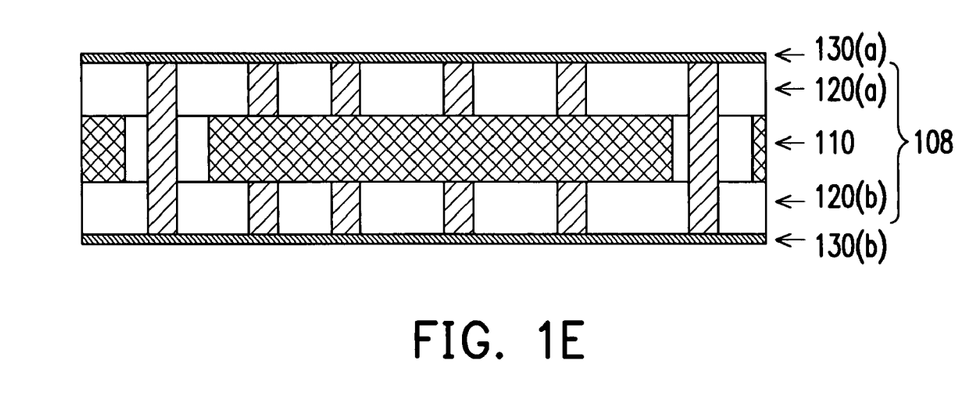

Referring to FIG. 1E, a conducting layer 130a and a conducting layer 130b are laminated on the two sides of laminating layer 108 respectively; i.e., the conducting layer 130a is laminated on the dielectric layer 120a; the conducting layer 130b is laminated on dielectric layer 120b.

Figure 1F:
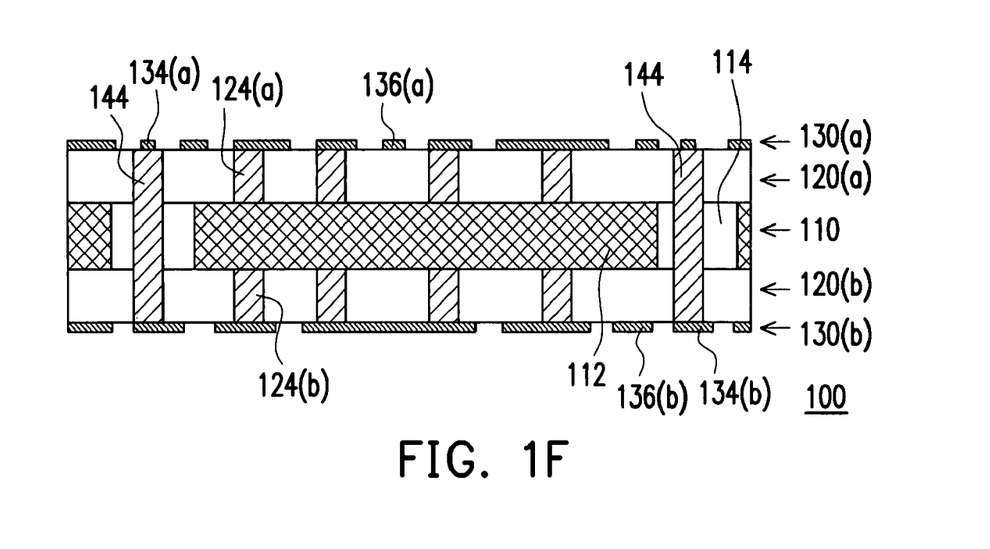

Referring to FIG. 1F, after laminating the conducting layer 130a and the conducting layer 130b, the photolithography and etching processes are performed to pattern the conducting layer 130a and conducting layer 130b. The patterned conducting layer 130a can be used as bonding pads 134a and conducting wires 136a. Some of bonding pads 134a are connected to the top of the conducting columns 124a or 144. Similarly, the patterned conducting layer 130b can be used as bonding pads 134b and conducting wires 136b. Some of bonding pads 134b are connected to the bottom of the conducting columns 124b or 144. Hence, the conducting layer 130a can be electrically connected with the conducting layer 130b via the conducting columns 124a, the core conducting layer 112 and the conducting columns 124b. The conducting layer 130a can also be electrically connected with the conducting layer 130b via the conducting columns 144. Finally, the fabrication of the circuit board 100 is completed.

Figure 2A:
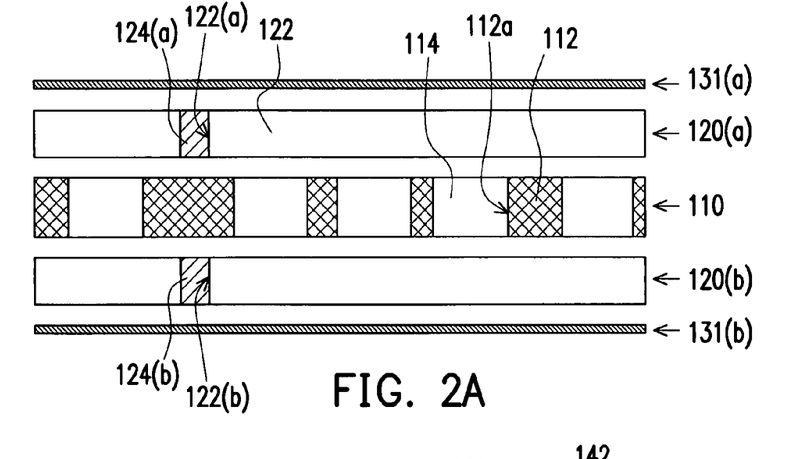
FIGS. 2A–2B are the initial and final cross-sections of the process of fabricating the second circuit board in accordance with a preferred embodiment of the present invention.
Figure 2B:
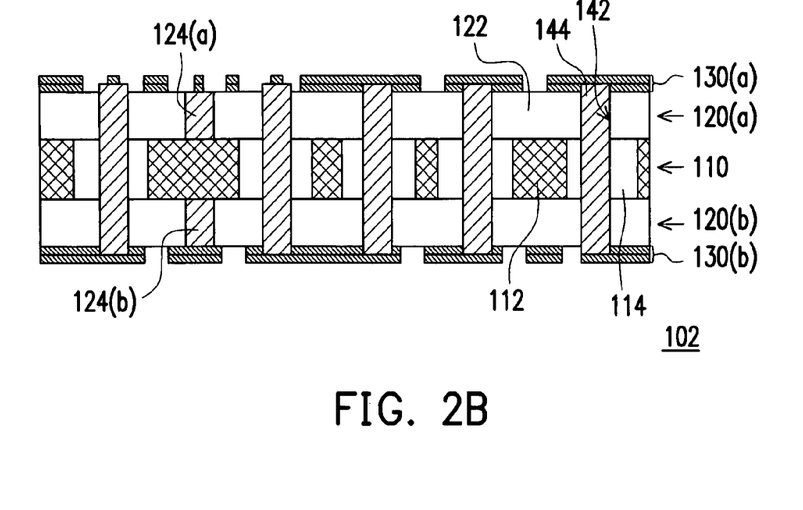

FIGS. 2A–2B are the initial and final cross-sectional views showing the process steps of fabricating the second circuit board in accordance with a preferred embodiment of the present invention. Like the first circuit board, the second circuit board in accordance with a preferred embodiment of the present invention is also a three-conducting-layer circuit board. Compared to the process of fabricating the first circuit board, this preferred embodiment further provides conducting layers 131a and 131b, in addition to a dielectric layer 120a (see FIG. 2A), a core layer 110, and a dielectric layer 120b. Then the process is carried out following the same steps shown in FIGS. 1B–1F to fabricate a circuit board 102 (shown in FIG. 2B). It should be noted that both of the patterned conducting layers 130a and 130b in FIG. 2B are double-layer conducting layer because in this embodiment, an additional conducting layer is require to cover the surface of the conducting columns 144.

In both of the first and second circuit boards, a core layer having a core conducting layer and a plurality of core dielectric columns is provided. In the third and the fourth circuit boards as shown in the following descriptions, a core layer is also provided initially. But this core layer includes a core dielectric layer and two conducting layers. Hence, this core layer has a double conducting wire structure.

FIGS. 3A–3F are the cross-sectional views showing the process steps of fabricating the third circuit board in accordance with a preferred embodiment of the present invention. The third circuit board in accordance with a preferred embodiment of the present invention is a four-conducting-layer circuit board.

Figure 3A:
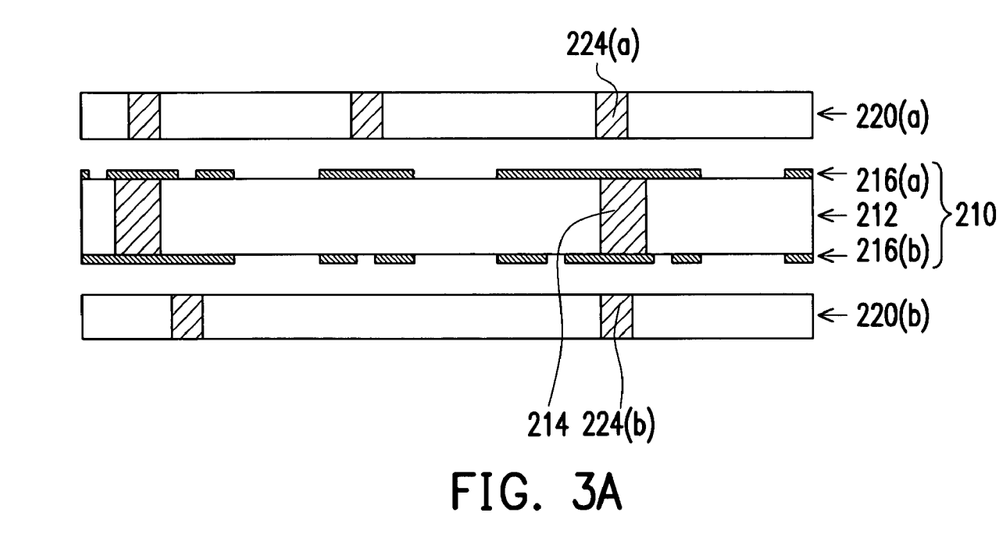
FIGS. 3A–3F are cross-sections of the process of fabricating the third circuit board in accordance with a preferred embodiment of the present invention.

Referring to FIG. 3A, a core layer 210, a dielectric layer 220a and dielectric layer 220b are provided. The core layer 210 includes a core dielectric layer 212, a plurality of core conducting column 214 passing through the core dielectric layer 212 and two patterned conducting layers 216a and 216b. The core conducting columns 214 are substantially coplanar with the two sides of core dielectric layer 212. The conducting layers 216a and 216b are positioned on the two sides of core dielectric layer 212. Hence, the conducting layer 216a is electrically connected with the conducting layer 216b via the core conducting column 214. Further, the dielectric layer 220a includes a plurality of conducting columns 224a that pass through dielectric layer 220a. The conducting columns 224a are disposed within the through holes of the dielectric layer 220a and are substantially coplanar with the two sides of dielectric layer 220a. Dielectric layer 220b includes a plurality of conducting columns 224b that pass through dielectric layer 220b. The conducting columns 224b are disposed within the through holes of the dielectric layer 220b and are substantially coplanar with the two sides of dielectric layer 220b.

Figure 3B:
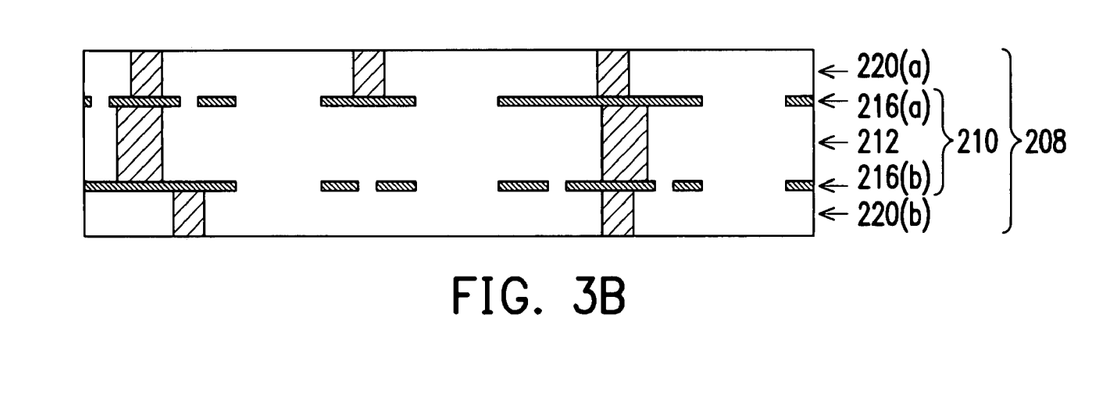

Referring to FIG. 3B, the dielectric layer 220a, the core layer 210, and the dielectric layer 220b are then laminated to form a laminating layer 208. Hence, the conducting columns 224a is electrically connected with the core conducting column 214; the conducting columns 224b electrically is connected with the core conducting column 214 and thus can be electrically connected with the conducting columns 224a via the core conducting column 214.

Figure 3C:
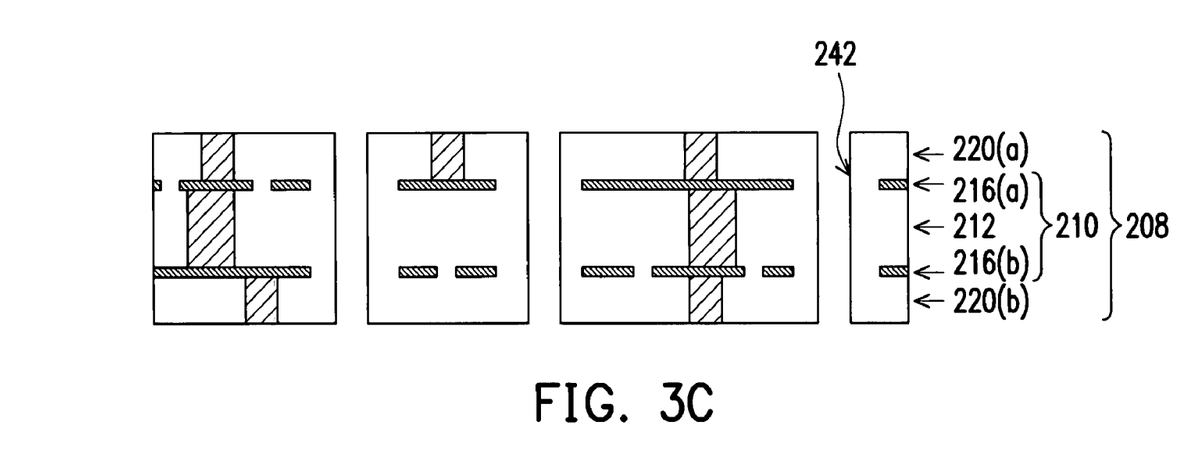

Referring to FIG. 3C, after the laminating layer 208 is formed, a plurality of through holes 242 are formed by using mechanical drilling or laser drilling. The through holes 242 passes through the dielectric layer 220a, the core dielectric layer 212, and the dielectric 220b, and connect the two sides of the laminated layer 108.

Figure 3D:
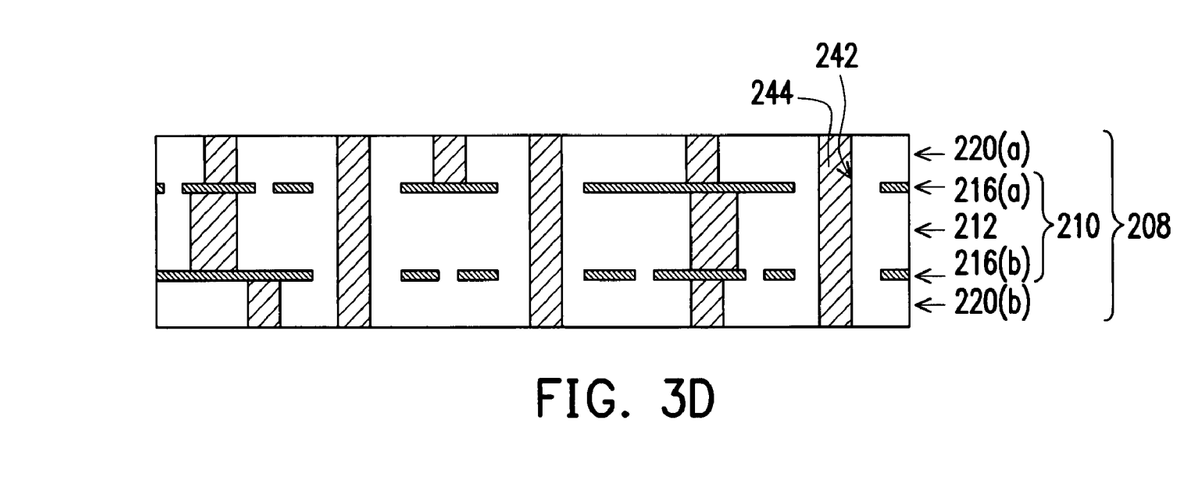

Referring to FIG. 3D, the through holes 242 are filled with a conducting material (such as conducting paste) to form a plurality of conducting columns 244. Those conducting columns 1244 are coplanar with the two sides of laminating layer 208.

Figure 3E:
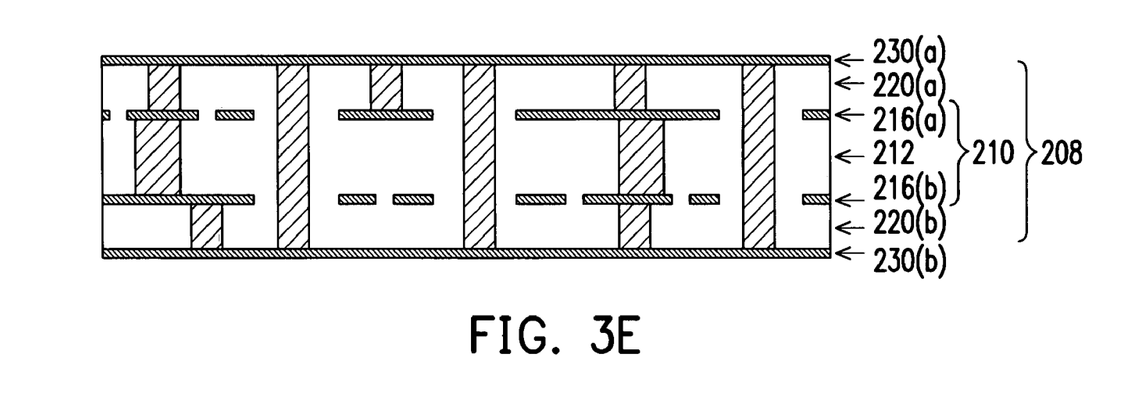

Referring to FIG. 3E, a conducting layer 230a and a conducting layer 230b are laminated on the two sides of laminating layer 108 respectively; i.e., conducting layer 230a is laminated on the dielectric layer 220a; conducting layer 230b is laminated on the dielectric layer 220b.

Figure 3F:
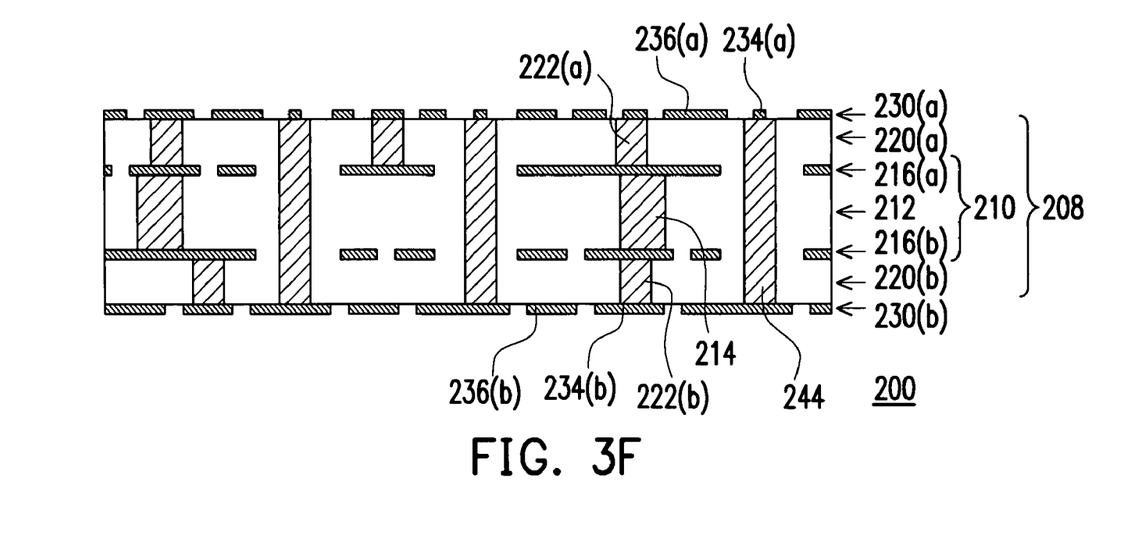

Referring to FIG. 3F, after laminating the conducting layer 230a and the conducting layer 230b, the photolithography and etching processes are carried out to pattern the conducting layer 1230a and the conducting layer 230b. The patterned conducting layer 130a can be used as bonding pads 234a and conducting wires 236a. Some of bonding pads 234a are connected to the top of the conducting columns 224a or 244. Similarly, the patterned conducting layer 230b can be used as bonding pads 234b and conducting wires 236b. Some of bonding pads 234b are connected to the bottom of the conducting columns 224b or 244. Hence, the conducting layer 230a can be electrically connected with the conducting layer 230b via the conducting columns 224a, the core conducting column 214 and the conducting columns 224b. The conducting layer 230a can also be electrically connected with conducting layer 230b via the conducting columns 244. Finally, the fabrication of the circuit board 200 is completed.

Figure 4A:
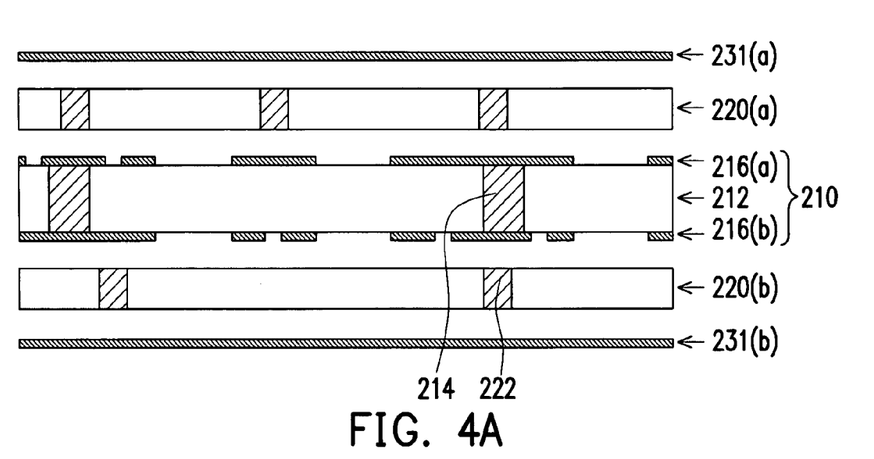
FIGS. 4A–4B are the initial and final cross-sections of the process of fabricating the fourth circuit board in accordance with a preferred embodiment of the present invention.
Figure 4B:
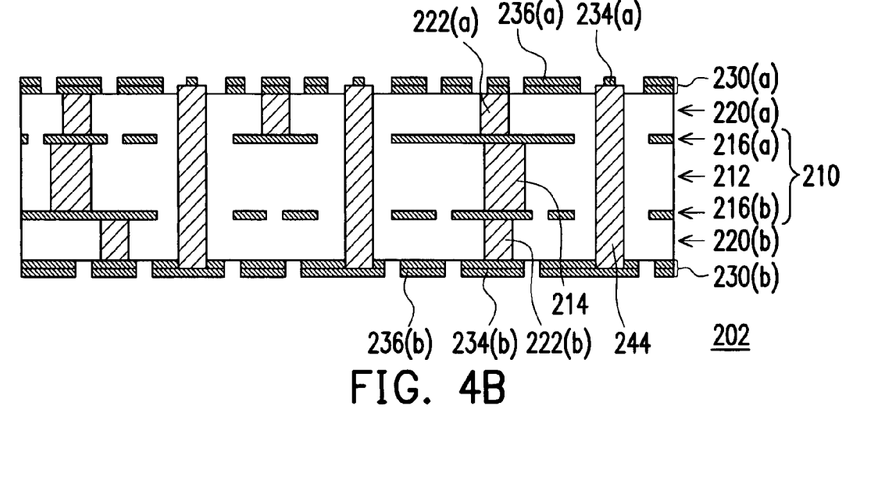

FIGS. 4A–4B are the initial and final cross-sectional views of the process steps of fabricating the fourth circuit board in accordance with a preferred embodiment of the present invention. Like the third circuit board, the fourth circuit board in accordance with a preferred embodiment of the present invention is also a four-conducting-layer circuit board. Compared to the process of fabricating the third circuit board, this preferred embodiment further provides conducting layers 231a and 231b, in addition to a dielectric layer 220a (see FIG. 4A), a core layer 210, and a dielectric layer 220b. Then the process carried out following the same steps shown in FIGS. 3B-3F to fabricate a circuit board 202 (shown in FIG. 4B). It should be noted that both of the patterned conducting layers 230a and 230b in FIG. 4B are double-layer conducting layer because in this embodiment, an additional conducting layer is required to cover the surface of the conducting columns 244.

Therefore, the present invention not only can fabricates two- to four-conducting-layer circuit board, but also can use the aforementioned circuit boards as circuit board units to fabricate circuit boards having more than four conducting layers.

Figure 5:
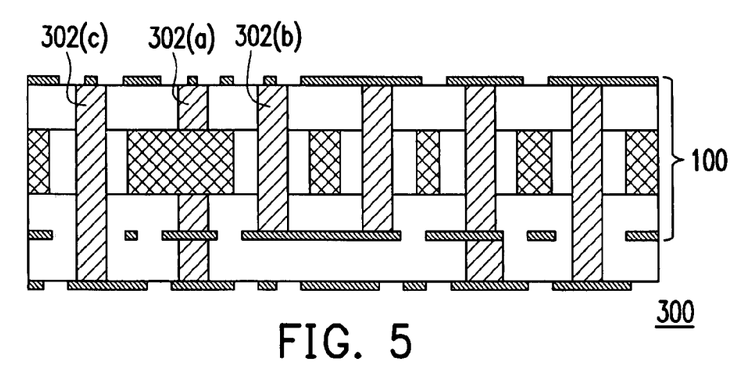
FIG. 5 is the cross-section of a circuit board having four conducting layers in accordance with a preferred embodiment of the present invention.

FIG. 5 is the cross-section of a circuit board having four conducting layers in accordance with a preferred embodiment of the present invention. A circuit board 300 includes a circuit board 100 (shown in FIG. 1F), a dielectric layer, and a patterned conducting layer. Conducting column 302c can be formed in the circuit board 300 to electrically connect the patterned conducting layers, in addition to conducting columns 302a and 302b.

Figure 6:
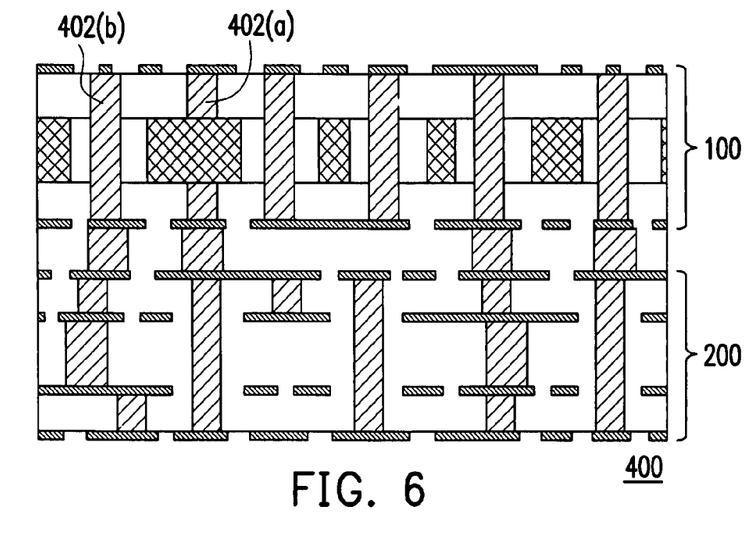
FIG. 6 is the cross-section of a circuit board having seven conducting layers in accordance with a preferred embodiment of the present invention.

FIG. 6 is the cross-section of a circuit board having seven conducting layers in accordance with a preferred embodiment of the present invention. A circuit board 400 includes a circuit board 100 shown in FIG. 1F and a circuit board 200 shown in FIG. 3F. Those patterned conducting layers in circuit board 400 can be electrically connected each other via those conducting columns 402a and 402b.

The present invention employs a core layer as a base layer, wherein the core layer is a core conducting layer, or is a core dielectric layer with two conducting layers. By using this core layer, a three-conducting-layer circuit (shown in FIG. 1F) board or a four-conducting-layer circuit board (shown in FIG. 3F) is fabricated. Furthermore, both circuit boards can be used as circuit board units to fabricate circuit boards having more than four conducting layers.

Accordingly, the present invention adopts lamination processes and equipment instead of complicated build-up process. The present invention effectively reduces the production costs and simplifies the process cycle for fabricating circuit boards, and thus is suitable for mass production.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A process of fabricating a circuit board, comprising:
   (a) providing a core layer, a first dielectric layer, and a second dielectric layer, said first dielectric layer including at least a first conducting column passing through said first dielectric layer, said second dielectric layer including at least a second conducting column passing through said second dielectric layer;
   (b) laminating said core layer, said first dielectric layer, and said second dielectric layer to form a laminating layer, said core layer being positioned between said first dielectric layer and said second dielectric layer;
   (c) forming at least a first through hole passing through said laminating layer;
   (d) filling said first through hole with a conducting material to form a third conducting column; and
   (e) forming a first patterned conducting layer and a second patterned conducting layer on two sides of said laminating layer respectively.

2. The process of fabricating a circuit board of claim 1, wherein said core layer in step (a) includes a core conducting layer and at least a core dielectric column passing through said core conducting layer, and wherein said first through hole in step (c) passes through said core dielectric column.

3. The process of fabricating a circuit board of claim 1, wherein said core layer in step (a) includes a core dielectric layer, at least a core conducting column passing through said core dielectric layer, a third patterned conducting layer, and a fourth patterned conducting layer, said third patterned conducting layer and fourth patterned conducting layer being positioned on two sides of said core dielectric layer, and wherein said first through hole in step (c) passes through said core dielectric layer.

4. The process of fabricating a circuit board of claim 1, wherein step (a) further comprises providing an fifth conducting layer and an sixth conducting layer, wherein step (b) further comprises laminating said fifth conducting layer and said sixth conducting layer, said fifth conducting layer being laminated on said first dielectric layer, said sixth conducting layer being laminated on said second dielectric layer, and wherein step (e) further comprises patterning said fifth conducting layer and said sixth conducting layer.

5. The process of fabricating a circuit board of claim 1, further comprising:
  (f) laminating a third dielectric layer on the one side of said laminating layer, said third dielectric layer including at least a fourth conducting column through said third dielectric layer;
  (g) forming at least a second through hole passing through said laminating layer and said third dielectric layer; and
  (h) filling said second through hole with conducting a material to form a fifth conducting column.

6. The process of fabricating a circuit board of claim 5, further comprising:
  (i) forming a patterned seventh conducting layer on said third dielectric layer.

* * * * *